(12) United States Patent
Beshears et al.

(10) Patent No.: US 11,770,906 B2
(45) Date of Patent: Sep. 26, 2023

(54) 3D-PRINTED CERAMICS WITH CONDUCTOR INFUSION FOR ULTRA-HIGH-SPEED ELECTRONICS

(71) Applicant: Schlumberger Technology Corporation, Sugar Land, TX (US)

(72) Inventors: John Michael Beshears, Richmond, TX (US); Steven O. Dunford, Missouri City, TX (US)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 0 days.

(21) Appl. No.: 17/459,230

(22) Filed: Aug. 27, 2021

(65) Prior Publication Data
US 2023/0069147 A1    Mar. 2, 2023

(51) Int. Cl.
| H05K 1/11 | (2006.01) |
| H05K 3/12 | (2006.01) |
| H05K 3/46 | (2006.01) |
| H05K 1/05 | (2006.01) |
| H05K 1/16 | (2006.01) |

(52) U.S. Cl.
CPC .......... *H05K 3/4608* (2013.01); *H05K 1/053* (2013.01); *H05K 1/114* (2013.01); *H05K 1/16* (2013.01); *H05K 3/1291* (2013.01)

(58) Field of Classification Search
CPC ..... H05K 1/0306; H05K 3/1291; H05K 1/115
See application file for complete search history.

(56) References Cited

U.S. PATENT DOCUMENTS

| 5,072,520 A | 12/1991 | Nelson |
| 5,108,553 A | 4/1992 | Foster |
| 5,358,825 A | 10/1994 | James |
| 5,721,007 A | 2/1998 | Lynch |
| 5,849,355 A | 12/1998 | McHenry |
| 6,035,527 A | 3/2000 | Tamm |
| 6,515,218 B1 * | 2/2003 | Shimizu .............. H01L 31/0512 438/66 |
| 6,556,754 B2 | 4/2003 | Simmons |
| 6,850,684 B2 | 2/2005 | Simmons |
| 8,546,717 B2 | 10/2013 | Stecker |
| 8,598,523 B2 | 12/2013 | Stecker |
| 8,809,780 B2 | 8/2014 | Wollenhaupt |
| 8,961,167 B2 | 2/2015 | Swanson |

(Continued)

FOREIGN PATENT DOCUMENTS

| JP | 2014120678 A | 6/2014 |
| KR | 20160129522 A | 11/2016 |

OTHER PUBLICATIONS

Office Action issued in U.S. Appl. No. 16/156,750 dated Jul. 18, 2022, 9 pages.

(Continued)

*Primary Examiner* — Jeremy C Norris
(74) *Attorney, Agent, or Firm* — Ashley E. Brown

(57) ABSTRACT

The disclosure provides for methods of making electrically conductive apparatus, such as circuit boards. The methods include 3D-printing a ceramic material into a ceramic substrate that includes a void. A conductive material is infused into the void. The conductive materiel forms electrically conductive connections within the apparatus. Also disclosed are apparatus formed by the methods.

25 Claims, 9 Drawing Sheets

(56) References Cited

U.S. PATENT DOCUMENTS

| | | |
|---|---|---|
| 9,126,365 B1 | 9/2015 | Mark |
| 9,149,988 B2 | 10/2015 | Mark |
| 9,156,205 B2 | 10/2015 | Mark |
| 10,600,739 B1 | 3/2020 | Herrault et al. |
| 2003/0038372 A1 | 2/2003 | Sasaki et al. |
| 2008/0224937 A1 | 9/2008 | Kimura et al. |
| 2011/0124299 A1 | 5/2011 | Koujima et al. |
| 2016/0157341 A1 | 6/2016 | Lee et al. |
| 2016/0165721 A1 | 6/2016 | Kwon et al. |
| 2016/0198576 A1 | 7/2016 | Lewis et al. |
| 2019/0299518 A1 | 10/2019 | Armiento et al. |
| 2020/0120813 A1 | 4/2020 | Dunford et al. |
| 2020/0256742 A1* | 8/2020 | Beckman ............... H01L 35/20 |
| 2020/0315035 A1 | 10/2020 | Shabtai et al. |

OTHER PUBLICATIONS

Office Action issued in U.S. Appl. No. 16/156,750 dated Oct. 5, 2021, 12 pages.

Office Action issued in U.S. Appl. No. 16/156,750 dated Mar. 31, 2022, 11 pages.

Hori, S. et al., "Fabrication of Oxide Thermoelectric Module Consisting of Multi-Layered Thick Films", 2006 25th International Conference on Thermoelectrics, 2006, pp. 480-483.

Li et al., 2021, Compact Multilayer Bandpass Filter Using Low-Temperature Additively Manufacturing Solution, IEEE Transactions on Electron Devices, vol. 68, No. 7, Jul. 2021 (7 pages).

Deloitte, 2017, 3D Opportunity for Electronics, Additive Manufacturing Powers up, Deloitte University Press, A Deloitte series on additive manufacturing (20 pages).

Hanson, 2021, Additive manufacturing is being used more to make high-end electronics, Additive Report, Apr. 1, 2021 (4 pages).

Rahman et al., 2015, Aerosol based direct-write micro-additive fabrication method for sub-mm 3D metal-dielectric structures, Journal of Micromechanics and Microengineering, 25 (2015) (8 pages).

Espera Jr. et al., 2019, 3D-printing and advanced manufacturing for electronics, Progress in Additive Manufacturing, Sep. 2019 (24 pages).

Yang et al., 2019, Metal particle-free inks for printed flexible electronics, Journal of Materials Chemistry C, 2019 (20 pages).

Carranza et al., 2019, Design and Hybrid Additive Manufacturing of 3-D/Volumetric Electrical Circuits, IEEE Transations on Components, Packaging and Manufacturing Technology, vol. 9, No. 6, Jun. 2019 (8 pages).

Chen et al., 2019, 3D printing of ceramics: A review, Journal of the European Ceramic Society vol. 39, Issue 4, 2019, pp. 661-687.

Phenomena in Cross Section of Plated Through Holes, (2010) downloaded on May 4, 2023 from link, http://www.ipc.org/toc/plated-thru-hole-poster-DEMO.pdf (1 page).

International Search Report and Written Opinion of PCT Application PCT/US2022/041047 dated Dec. 1, 2022, 11 pages.

Office Action issued in U.S. Appl. No. 16/156,750 dated Mar. 16, 2023, 14 pages.

* cited by examiner

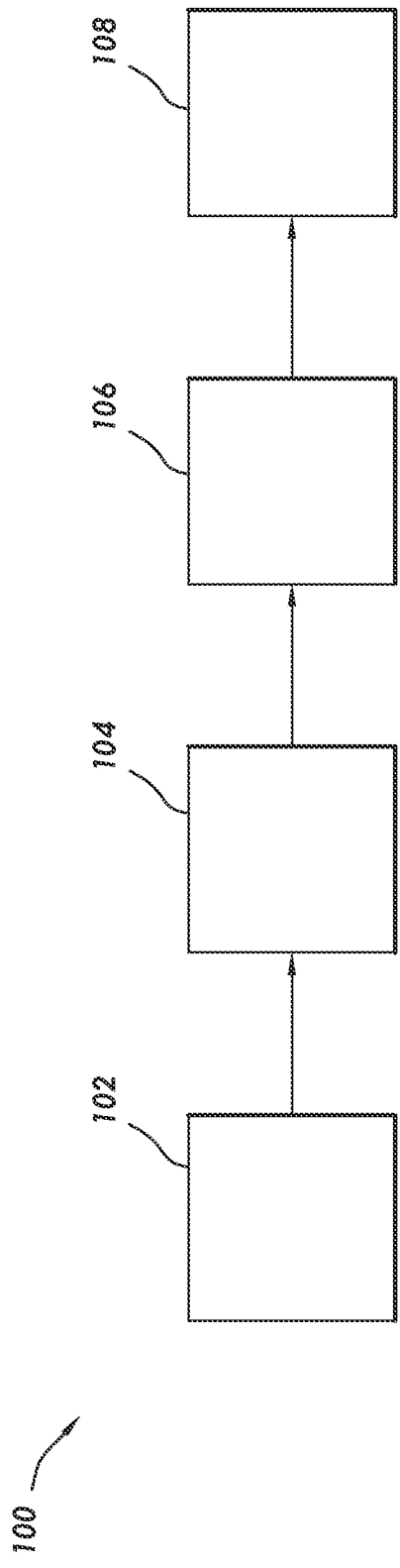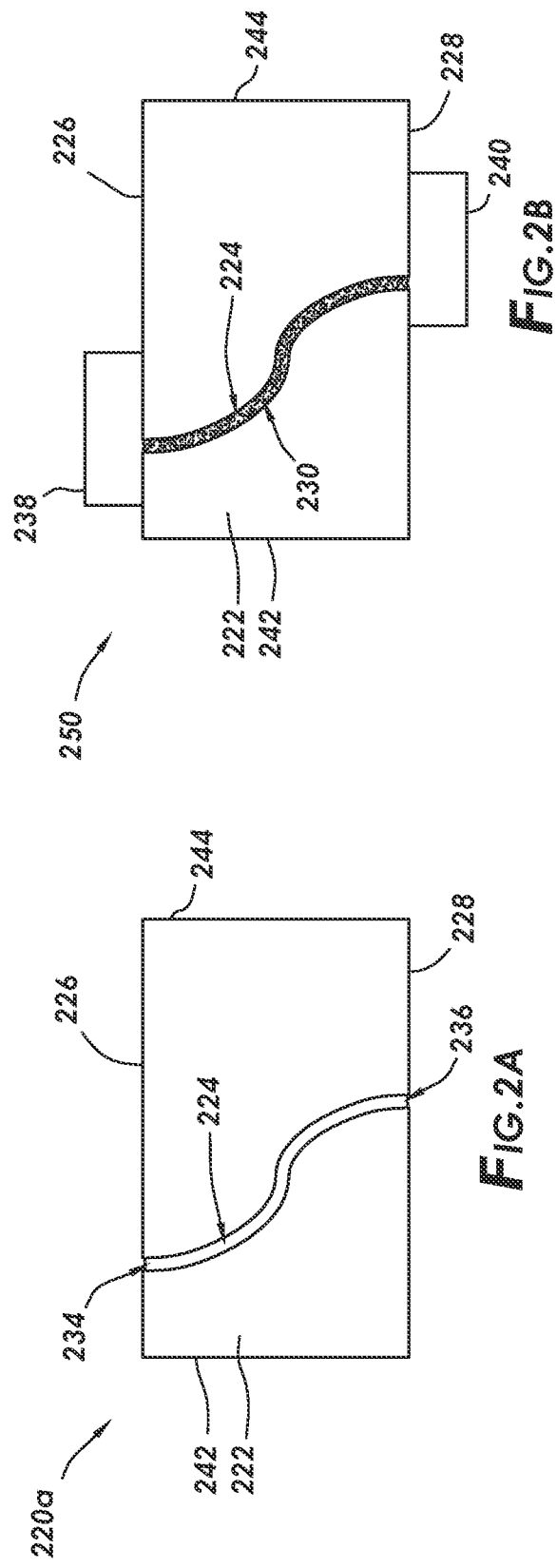

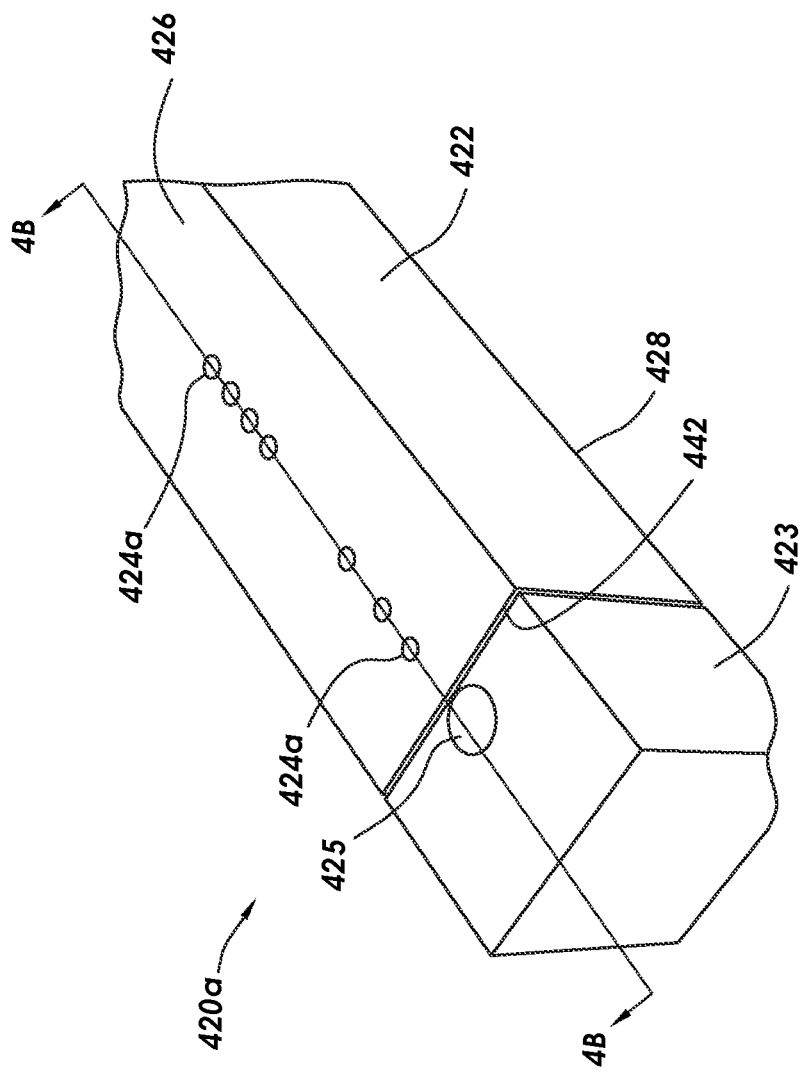

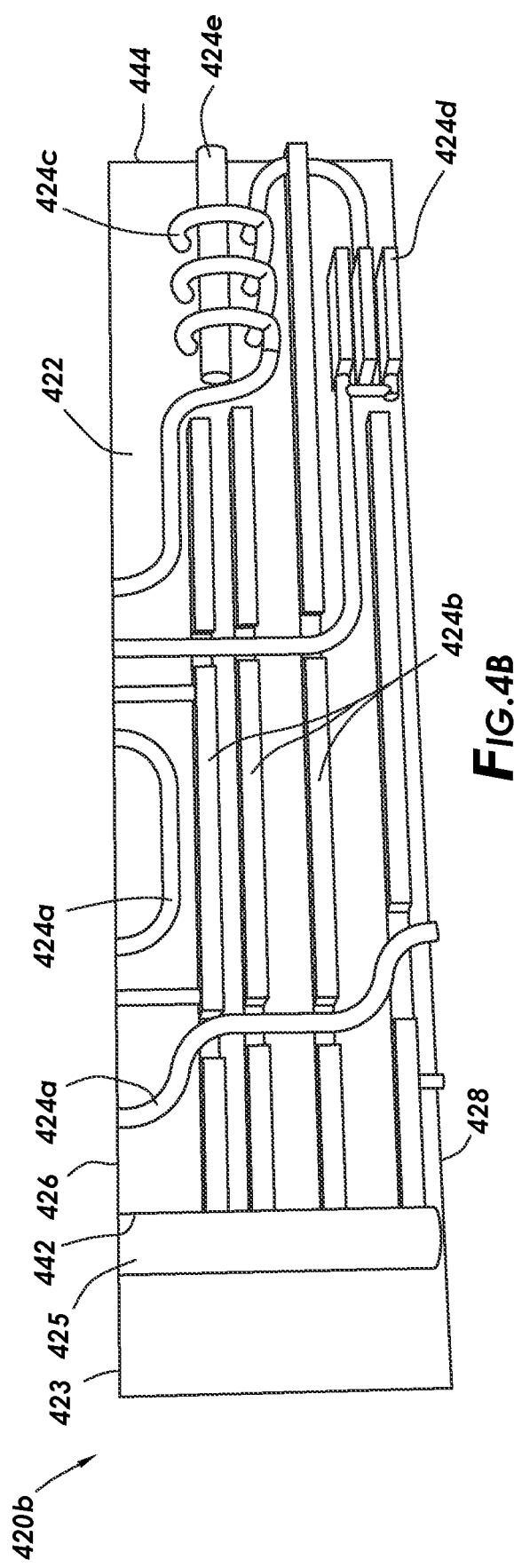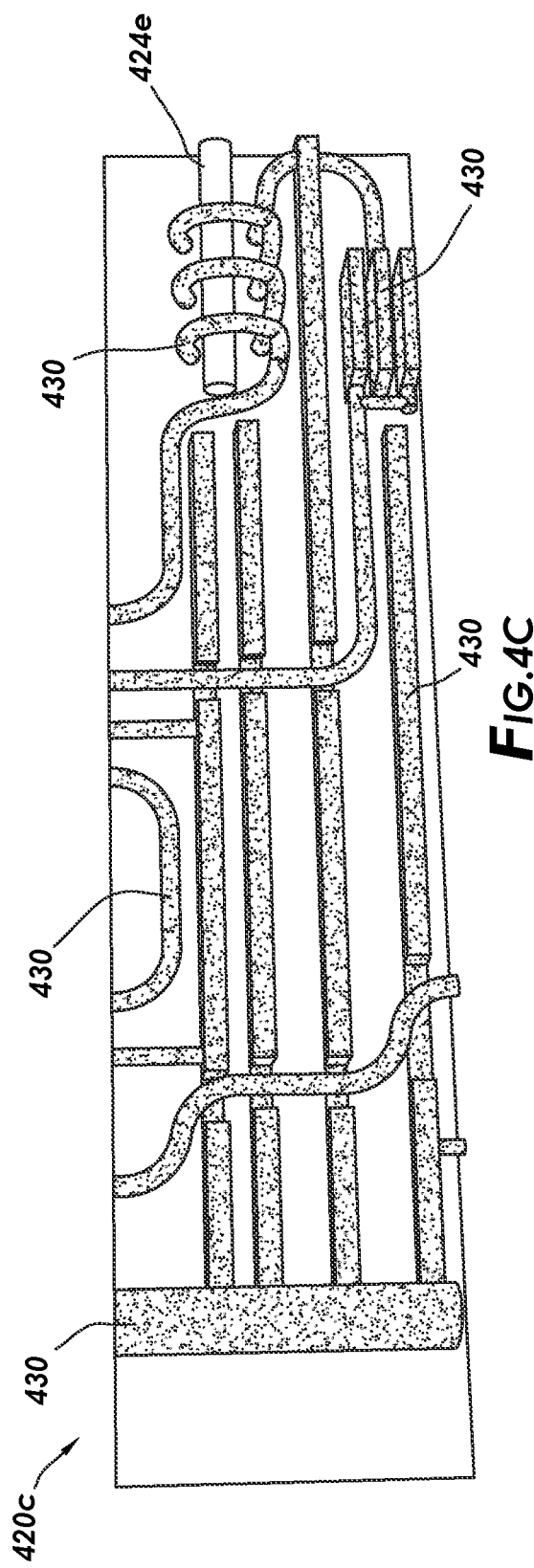

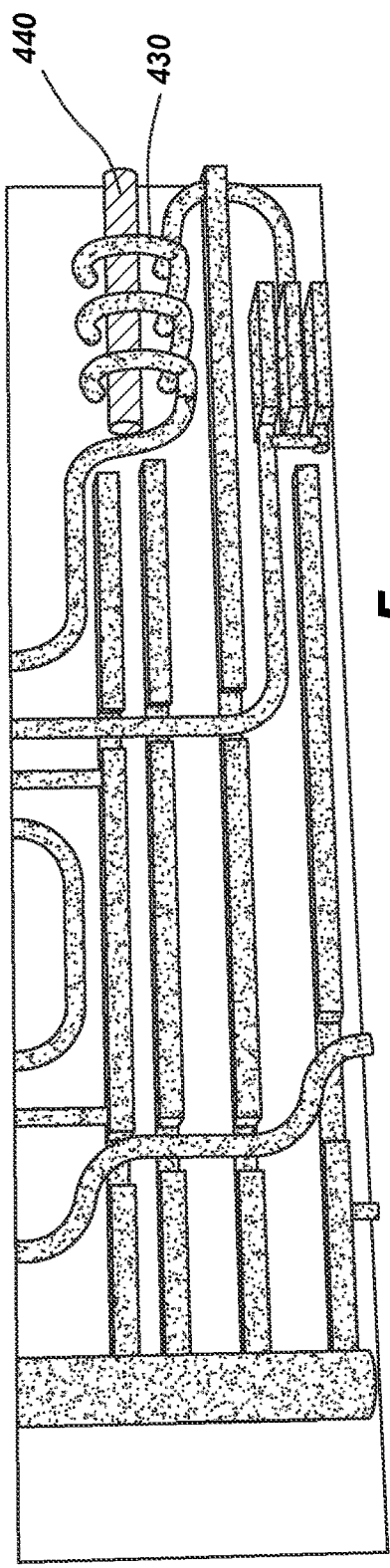
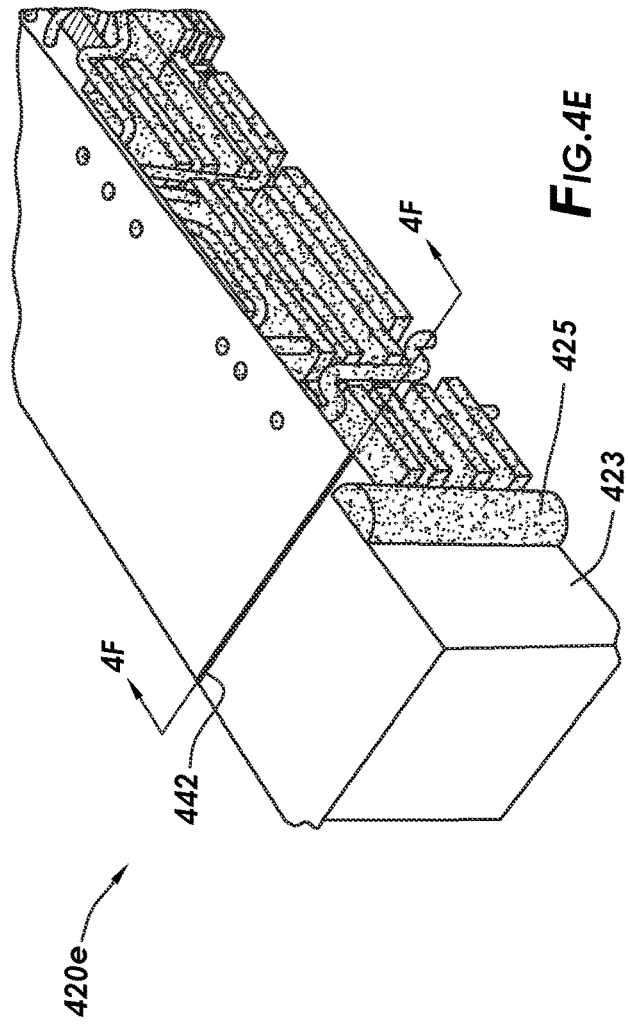
FIG.4D
FIG.4E

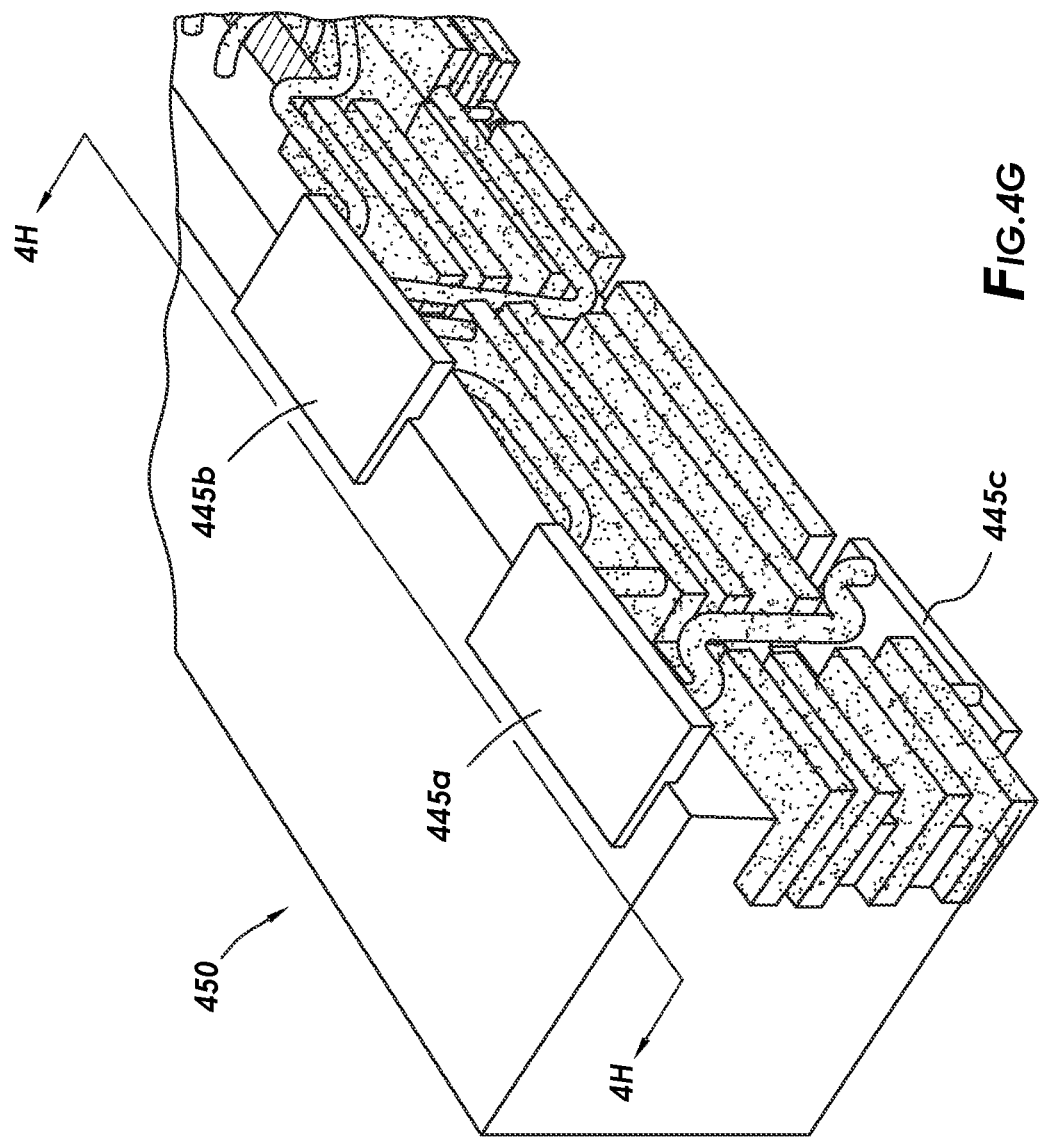

3D-PRINTED CERAMICS WITH CONDUCTOR INFUSION FOR ULTRA-HIGH-SPEED ELECTRONICS

FIELD

The present disclosure relates to 3D-printed ceramics with conductor infused therein for use in ultra-high-speed electronics, such as for wellbore applications; to systems including the same; to methods of making and using the same; and to systems for making the same.

BACKGROUND

A printed circuit board (PCB) includes a substrate supporting electrical components and electrically conductive connections. One process for making PCBs includes using 3D-circuit printers that print relatively low-temperature polymer resins into the form of a three-dimensional substrate and print conductive inks onto the substrate in the form of electrical components and connections. Such polymer resins and conductive inks are incapable of operation at certain harsh conditions, such as temperatures exceeding the melting point or softening point of the polymer resin and/or the melting point of the conductive inks.

Other processes for making PCBs include using sintering to form electrical components and connections. While sintering allows the use of relatively higher melting point conductive materials, in comparison to conductive inks, such PCBs exhibit shortened lifespans when subject to vibration or shock due to the presence of micro-voids that result from the sintering process.

BRIEF SUMMARY

Some embodiments of the present disclosure include a method of making an electrically conductive apparatus. The method includes 3D-printing a ceramic material into a ceramic substrate. The ceramic substrate includes a void. The method includes infusing a material into the void, and retrieving the ceramic substrate with the material within the void. The material is electrically conductive.

Some embodiments of the present disclosure include a method of making an electrically conductive apparatus. The method includes 3D-printing a first ceramic material into a first portion of a ceramic substrate. The first portion of the ceramic substrate includes a first void. The method includes infusing a first material into the first void. The method includes forming a second portion of the ceramic substrate by 3D-printing a second ceramic material onto the first portion of the ceramic substrate. The second portion of the ceramic substrate includes a second void. The method includes infusing a second material into the second void, and retrieving the ceramic substrate with the first and second material within the first and second voids. The first and second materials are electrically conductive materials.

Some embodiments of the present disclosure include a circuit board. The circuit board includes a ceramic substrate having a plurality of voids. An electrically conductive material is within the plurality of voids, and defines an electrically conductive wiring assembly of the circuit board. The electrically conductive wiring assembly includes a via and lacks capture pads.

BRIEF DESCRIPTION OF THE DRAWINGS

So that the manner in which the features of the compositions, articles, systems and methods of the present disclosure may be understood in more detail, a more particular description briefly summarized above may be had by reference to the embodiments thereof which are illustrated in the appended drawings that form a part of this specification. It is to be noted, however, that the drawings illustrate only various exemplary embodiments and are therefore not to be considered limiting of the disclosed concepts as it may include other effective embodiments as well.

FIG. 1 is a flow chart of a method of forming a PCB in accordance with some embodiments of the present disclosure.

FIG. 2A depicts a ceramic substrate, formed via 3D-printing, having a void defining a pathway for a conductive trace in accordance with some embodiments of the present disclosure.

FIG. 2B depicts the ceramic substrate of FIG. 2A, after infusion of a conductive metal into the void to form the conductive trace in accordance with some embodiments of the present disclosure.

FIG. 4A depicts another ceramic substrate, formed via 3D-printing, having voids for receipt of electrically conductive materials in accordance with some embodiments of the present disclosure.

FIG. 4B is a cross-sectional view of the ceramic substrate of FIG. 4A, along line 4B-4B.

FIG. 4C depicts the ceramic substrate of FIG. 4B, with conductive material infused within voids of the ceramic substrate.

FIG. 4D depicts the ceramic substrate of FIG. 4C, with a component or material inserted within a void of the ceramic substrate.

FIG. 4E is another view of the ceramic substrate of FIG. 4D, showing line 4F-4F along which a body segment of the ceramic substrate is removed.

FIG. 4G depicts the ceramic substrate of FIG. 4F after installation of components onto the ceramic substrate.

DETAILED DESCRIPTION

Figure 2C:
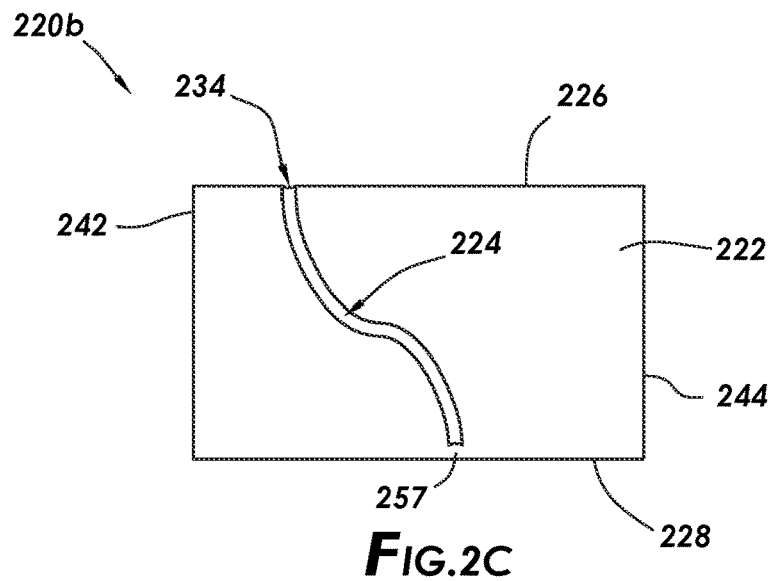
FIG. 2C depicts a ceramic substrate, formed via 3D-printing, having a void that is open at one end and closed at another end in accordance with some embodiments of the present disclosure.

The present disclosure includes 3D-printed ceramic articles having electrically conductive material infused into a ceramic substrate (e.g., into voids within the ceramic substrate). The articles disclosed herein may be or include PCBs that have 3D-printed ceramic substrates and electrical components and connections. 3D-printing the substrates provides the ability to form substrates having a desired geometry and desired features, including voids at desired positions on the substrates for subsequent receipt of liquid (e.g., molten) electrically conductive material during infusion. The use of ceramic as the material for the substrate provides substrates having relatively high melting points (e.g., in comparison with the relatively low-melting point polymer resins), and provides the ability to use electrically conductive materials having relatively high melting points (e.g., in comparison with the relatively low-melting point conductive inks).

3D-Printing Ceramic Substrates

Some embodiments of the present disclosure include methods of making articles, including methods of making PCBs, using additive manufacturing (3D-printing) and material infusion processes. With reference to FIG. 1, method 100 includes 3D-printing a ceramic material into the shape and form of a PCB substrate, box 102. The 3D-printing may be performed using a 3D-ceramic printer. The ceramic material disclosed herein may be or include low temperature co-fired ceramic (LTCC) or a high temperature co-fired ceramic (HTCC). Some examples of ceramic materials that may be used in accordance with this disclosure include Zirconia, Aluminas ($Al_2O_3$), Aluminum Nitride, Silicates, Silicon Nitride, synthetic quartz, and fused silica (silicon oxide, $SiO_2$). In some embodiments, the ceramic substrates that are 3D-printed from the ceramic material (and the PCBs formed therefrom) are capable of being subjected to temperatures ranging from −200° C. to 350° C. without melting and while maintaining reliability and functionality. In some embodiments, the ceramic substrates disclosed herein do not include polymer resin. In some embodiments, the ceramic substrate disclosed herein includes 100 wt. % of the ceramic material based on a total weight of the ceramic substrate. In some embodiments, the ceramic material is an electrically insulating material.

Using 3D-printing, the ceramic substrates disclosed herein may be made to have a desired geometry that includes desired features, such as voids at desired positions on or in the ceramic substrates for subsequent receipt of liquid (e.g., molten) electrically conductive material during material infusion. The voids may be, but are not limited to, holes (e.g., through holes) defining where electrical components or leads can be positioned (e.g., microvias); cavities defining where surface mounted electrical components can be positioned; and channels defining pathways for conductive traces and leads through the ceramic substrates or along surfaces of the ceramic substrates.

One exemplary 3D-printed ceramic substrate, in cross section, is depicted in FIG. 2A. Ceramic substrate 220a includes a body 222, including the ceramic material. Ceramic substrate 220a is 3D-printed to have cavity 224 extending through body 222. Cavity 224 extends from first surface 226 of body 222 to second surface 228 of body 222. As shown, cavity 224 has a generally curvilinear extension from first surface 226 to second surface 228, and lacks right angle turns. However, the ceramic substrates disclosed herein are not limited to having cavities with curvilinear extensions. Cavity 224 defines a pathway within which an electrical connection may subsequently be formed. Cavity 224 includes openings 234 and 236 to allow for infusion of electrically conductive material therein. In some embodiments, as shown in FIG. 2C, one or more of the openings into the cavities of the ceramic substrates are closed prior to and during material infusion, and are subsequently opened. Ceramic substrate 220b in FIG. 2C is substantially identical to ceramic substrate 220a of FIG. 2A, with the exception that cavity 224 is closed at second surface 228 at closed end 257, and lacks opening 236. Thus, the ceramic substrates may have at least one opening (e.g., opening 234) for receipt of the electrically conductive material into the voids (e.g., cavity 224) of the ceramic substrates, and may be enclosed on one or more sides, such that the liquid (e.g., molten) electrically conductive material is retained therein after infusion and prior to cooling and hardening of the electrically conductive material. For example, in FIG. 2C, ceramic substrate 220b includes opening 234 on side 226, but is enclosed on the remaining sides 228, 242, and 244. Thus, liquid electrically conductive material can be infused into cavity 224 through opening 234, and the enclosed sides 228, 242, and 244 will retain the liquid electrically conductive material within ceramic substrate 220b. After cooling and hardening of the conductive metal, portions of the enclosed sides 228, 242, and 244 can be opened, as desired. For example, closed end 257 of cavity 224 may be opened by removal of ceramic material enclosing cavity at side 228.

Figure 3A:
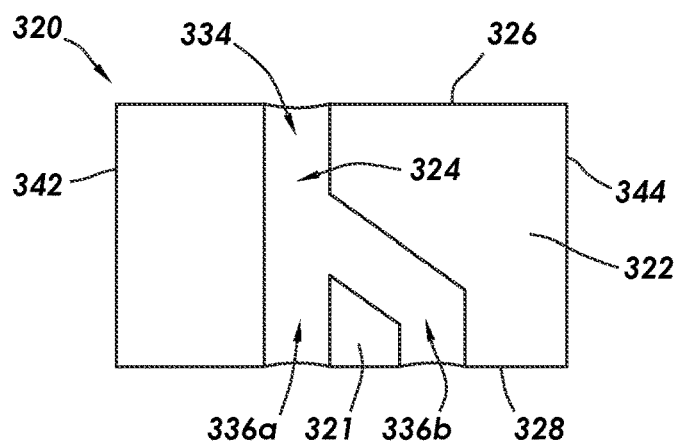
FIG. 3A depicts a ceramic substrate, formed via 3D-printing, having a void defining a space for a via in accordance with some embodiments of the present disclosure.

FIG. 3A depicts another exemplary 3D-printed ceramic substrate, in cross section. Ceramic substrate 320 includes a body 322, including the ceramic material, and having sides 326, 328, 342, and 344. Ceramic substrate 320 is 3D-printed to have cavity 324 extending through body 322. Cavity 324 extends from first surface 326 of body 322 to second surface 328 of body 322. As shown, cavity 324 defines a space within which a via can be formed. Cavity 324 includes a single opening 334 on surface 326, and two openings 336a and 336b on second surface 328. Between two openings 336a and 336b, body 222 includes split 321. FIG. 3A is just one example of the geometries that can be attained by 3D-printing the ceramic substrates disclosed herein. One skilled in the art would understand that the ceramic substrates disclosed herein are not limited to having the structures shown in FIGS. 2A and 3A, and that the ceramic material can be made to have other desired shapes, features, and voids that are achievable using 3D-printing techniques.

In some embodiments, after 3D-printing the ceramic substrates, the method includes subjecting the ceramic substrates to additional processing to achieve the desired shape and/or surface features prior to applying metal to the ceramic substrates. In other embodiments, after 3D-printing the ceramic substrates, the ceramic substrates are not subjected to additional processing steps prior to applying metal to the ceramic substrates.

Infusion of Conductive Material into Ceramic Substrates

Referring back to FIG. 1, after 3D-printing the ceramic material into the shape and form of the ceramic substrate, method 100 includes applying an electrically conductive material into and/or onto the ceramic substrate, box 104. The electrically conductive material may be applied to one or more surfaces of the ceramic substrate and/or within one or more voids of the ceramic substrate. For example, the electrically conductive material may be applied within one or more cavities in the ceramic substrate; within one or more holes (e.g., through holes) in the ceramic substrate; or within one or more channels in the ceramic substrate.

The electrically conductive material may be or include an electrically conductive metal. For example, and without limitation, the metal may be or include copper, aluminum, silver, tungsten, or iron. In some embodiments, the electrically conductive material is entirely composed of a single metal, such as 100 wt. % copper. In other embodiments, the metal is an alloy. In some embodiments, the metal may be or include solder. In some embodiments, the metal is a non-sintered metal. In some embodiments, the conductive metal disclosed herein does not include a conductive ink. The electrically conductive material may be or include a non-metal. For example, the electrically conductive material may be or include a carbon-based electrically conductive material, such as carbon nanotubes or graphene. In some embodiments, the electrically conductive material is entirely composed of one or more non-metals.

In some embodiments, the electrically conductive material is molten when applied to the ceramic substrate. In such embodiments, the ceramic material has a higher melting temperature than the melting temperature of the electrically conductive material, such that the molten electrically conductive material can contact the ceramic substrate without melting the ceramic substrate. The electrically conductive material can be applied to the ceramic substrate via a molten material infusion process.

In some embodiments, the material infusion process includes melting the electrically conductive material, and then bringing the ceramic substrate into contact with the molten electrically conductive material. In some such embodiments, the ceramic substrate is inserted (e.g., dipped and/or immersed) into the liquid (e.g., molten) electrically conductive material. In other such embodiments, the electrically conductive material is deposited (e.g., poured) onto and/or into the ceramic substrate. In some embodiments, the electrically conductive material is plated onto and/or into the ceramic substrate. In some embodiments, the electrically conductive material is injected into and/or onto the ceramic substrate, such as via metal injection molding. In some embodiments, the infusion of the electrically conductive material into the void spaces of the ceramic substrate is similar to casting, with the ceramic substrate acting as a "mold" by defining the shape of the electrical components and connections to be formed by the electrically conductive material, with the ceramic substrate forming a part of the resultant PCB.

The ceramic substrate may have at least one opening for receipt of the electrically conductive material into the voids of the ceramic substrate. The ceramic substrate may be enclosed on one or more sides, such that the electrically conductive material is retained therein after infusion and prior to cooling and/or hardening of the electrically conductive material.

Using electrically conductive material infusion provides the ability to form conductive paths or traces in the 3D-printed ceramic substrate. The electrically conductive material may infuse into the voids of the ceramic substrate to form electrical components or connections of the PCB. In some embodiments, the ceramic substrate is 3D-printed to have holes within which the electrically conductive material is infused to form electrical connections for the resultant electrical circuit. For example, and without limitation, the electrically conductive material may infuse: into holes (e.g., through holes) in the ceramic substrate to form electrical components or leads (e.g., to form microvias); into surface cavities on the ceramic substrate to form surface mounted electrical components or connections; through surface channels on the ceramic substrate to form conductive traces or leads; or combinations thereof. The electrically conductive material may form a printed wiring assembly (PWA) on the ceramic substrate.

In some embodiments, the temperature of the ceramic substrate is reduced after 3D-printing the ceramic substrate and prior to infusion of the ceramic substrate with the electrically conductive material. The relatively high melting point of ceramic (i.e., higher than the melting point of the electrically conductive material) provides for the ability to infuse the ceramic substrate with electrically conductive materials having relatively high melting temperatures (i.e., higher than conductive inks, but lower than the ceramic material). The use of such electrically conductive materials having relatively high melting temperatures provides for the ability to form solid electrical components and connections (e.g., vias) that do not exhibit deficits that occur in electrical components and connections formed of electrically conductive material having relatively lower melting temperatures, such as temperature induced material stress.

In other embodiments, infusion of the electrically conductive material into the voids includes introducing a solution of or containing the electrically conductive material into the voids. In some such embodiments, introduction of the solution results in the electrically conductive material adhering to and lining walls of voids. The solution may be, for example and without limitation, a metal particle-free ink containing an electrically conductive material (e.g., metal) or a plating solution containing an electrically conductive material (e.g., metal). In some such embodiments, the electrically conductive material adhered to the walls of the voids forms hollow conductors within the voids, such as a through hole via or a waveguide. In such some embodiments, the hollow conductors are configured to receive an insert, such as a connector pin.

Facilitating Infusion

Referring back to FIG. 1, method 100 includes facilitating infusion of the electrically conductive material into and/or onto the ceramic substrate, box 106. In some embodiments, surface tension of the electrically conductive material forces the electrically conductive material into the voids of the ceramic substrate. In some embodiments, infusion of the electrically conductive material into desired positions on the ceramic substrate, such as into voids in the ceramic substrate, is facilitated. Facilitating of the infusion of the electrically conductive material can ensure proper adhesion of the electrically conductive material to ceramic at the desired positions on the ceramic substrate. Facilitating infusion of the electrically conductive material can include applying a surface treatment the ceramic substrate that encourages adherence of the electrically conductive material to the ceramic material, applying a surface treatment the ceramic substrate that discourages adherence of the electrically conductive material to the ceramic material, applying a force to the electrically conductive material that encourages infusion of the electrically conductive material in the ceramic substrate, or combinations thereof.

Applying a force to the electrically conductive material can include using centrifugal and/or centripetal force to facilitate infusion of the electrically conductive material into the ceramic substrate. For example, after filling the ceramic substrate with the electrically conductive material, the filled ceramic substrate may be subjected to spinning that forces the electrically conductive material into voids in the ceramic substrate.

Applying a force to the electrically conductive material can include applying a pressure differential (e.g., vacuum or relatively high pressure) to the electrically conductive material and ceramic substrate such that the electrically conductive material is drawn or forced into the voids of the ceramic substrate.

The surface treatment can include applying a precursor to the ceramic substrate prior to contacting the ceramic substrate with the electrically conductive material. The precursor can be a material that encourages wicking of the electrically conductive material along the surface of the ceramic material, accelerating the infusion of the electrically conductive material thereon. In some embodiments, the precursor is applied to the ceramic substrate only at locations corresponding with the desired positions of the conductive metal in the resultant PCB formed by the method disclosed herein. For example, the precursor may be applied only at the positions (e.g., voids) on the ceramic material where the electrically conductive material forms electrical components and/or electrical connections in the resultant PCB formed by the method disclosed herein.

The surface treatment can include treating a surface of the ceramic substrate to encourage the electrically conductive material to adhere to the surface of the ceramic substrate. In some embodiments, this surface treatment is applied only at positions on the ceramic substrate that correspond with positions where it is desired that the electrically conductive material form electrical components or connections on the resultant PCB formed by the methods disclosed herein. Thus, the surface treatment can be used to encourage the electrically conductive material to adhere to the ceramic substrate at the desired positions, while avoiding adherence of the electrically conductive material to at other positions on the ceramic substrate.

The surface treatment can include applying a resist to positions on the ceramic substrate where it is undesirable to apply electrically conductive metal. The resist can be a material that resists the adherence and/or plating of conductive metal on the surface of the ceramic substrate.

In some embodiments, before applying a surface treatment (e.g., precursor, resist) to the ceramic substrate, the method includes masking portions of the ceramic substrate where the surface treatment will not be applied. The masking can include positioning a cover material over portions of the ceramic substrate where the surface treatment will not be applied. The masking can prevent the surface treatment from contacting the masked areas of the ceramic substrate. For example, when applying a resist, the positions on the ceramic substrate where it is desirable to apply the metal can be masked. When applying a surface treatment that encourages electrically conductive material adhesion, the positions on the ceramic substrate where it is undesirable to apply the electrically conductive material can be masked. One example of a surface treatment that encourages adhesion includes applying palladium to the surface of the ceramic substrate. Another example of a surface treatment that encourages adhesion includes performing a plasma treatment on the surface of the ceramic substrate.

The circuit paths formed in accordance with the present disclosure can be designed to reduce the occurrence of air pockets and/or contaminants trapped within the resultant PCB. For example, the 3D-printed ceramic substrate can be subjected to material infusion, and then the electrically conductive material infused ceramic substrate can be moved or agitated to facilitate the flow of the electrically conductive material into the voids (e.g., holes) in the ceramic substrate. The flowing electrically conductive material can force air pockets and/or contaminants out of the ceramic substrate. The flow of the electrically conductive material can be facilitated by application of a pressure differential (e.g., a vacuum). In some embodiments, moving or agitating the electrically conductive material infused ceramic substrate to facilitate the flow of the electrically conductive material includes rotating the electrically conductive material infused ceramic substrate. Air pockets and/or contaminants that are not removed may outgas from the PCB, such as when the PCB is exposed to relatively high temperatures.

The various methods for facilitating infusion of the electrically conductive material disclosed herein may be used separately or in combination. For example, a resist may be used in conjunction with a surface treatment that promotes metal adhesion on the ceramic substrate. In such an embodiment, the resist is applied to the ceramic substrate at positions where the adherence of the metal to the ceramic is undesired, and a surface treatment that promotes metal adhesion on the ceramic substrate is performed at positions where the adherence of the metal to the ceramic substrate is desired. Thus, the present method provides for the selective adhesion of electrically conductive material to the ceramic at desired positions.

Retrieval of PCB

Method 100 includes retrieving a PCB, box 108. The retrieved PCB includes the ceramic substrate with the electrically conductive material.

In some embodiments, a temperature of the electrically conductive material infused PCB is reduced and, after the temperature is reduced, the electrically conductive material infused PCB is retrieved from the source of electrically conductive material. After retrieving the PCB from the source of electrically conductive material, a temperature of the electrically conductive material infused PCB is further reduced, while maintaining the infused electrically conductive material therein. Cooling and solidifying of the molten electrically conductive material forms a PCB that includes the ceramic substrate with the solidified conductive material forming conductive components and/or conductive connections in the PCB.

In some embodiments, the formation of the PCBs disclosed herein is performed in iterations. For example, and without limitation, a first portion of the ceramic substrate is 3D-printed. After 3D-printing the first portion of the ceramic substrate, a first material infusion is performed to apply a first portion of electrically conductive material to the first portion of the ceramic substrate. After applying the first portion of electrically conductive material, a second portion of the ceramic substrate is 3D-printed. After 3D-printing the second portion of the ceramic substrate, a second material infusion is performed to apply a second portion of metal to the ceramic substrate. These sequential steps of 3D-printing portions of the ceramic substrate followed by material infusion into the ceramic substrate can be repeated a desired number of times until the desired PCB is formed. Such iterative processing to form PCBs can be used, for example, to form PCBs having ceramic substrates with relatively complex shapes and PCBs having relatively complex arrays of electrical components and connections. Such iterative processing methods can be used to improve electrically conductive material coverage rates on the ceramic substrates.

A schematic of one exemplary PCB, in cross section, is depicted in FIG. 2B. PCB 250 of FIG. 2B is the same as ceramic substrate 220a of FIG. 2A, but with the addition of electrical connection 230 (e.g., conductive trace), electrical component 238 and electrical component 240. Electrical connection 230 is formed by infusing the electrically conductive material into the cavity 224. Electrical components 238 and 240 may also be formed via the material infusion process disclosed herein, or may be subsequently attached to ceramic substrate 220 and electrically coupled with electrical connection 230. As shown, electrical connection 230 electrically couples electrical component 238 with electrical component 240.

Figure 3B:
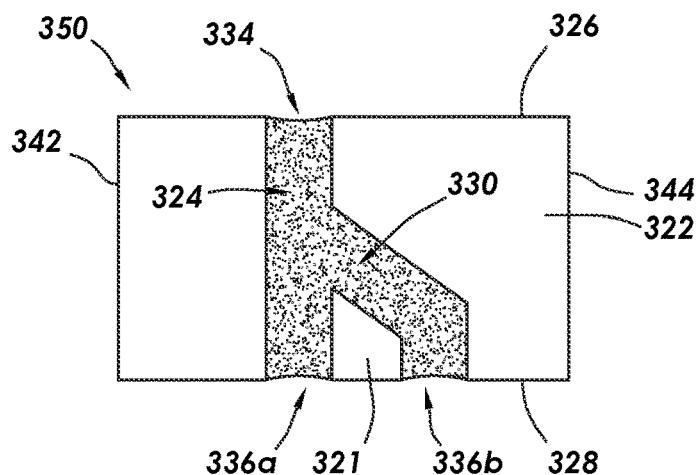
FIG. 3B depicts the ceramic substrate of FIG. 3A, after infusion of an electrically conductive material into the void to form the via in accordance with some embodiments of the present disclosure.

FIG. 3B depicts a schematic of another exemplary PCB, in cross section. PCB 350 of FIG. 3B is the same as ceramic substrate 320 of FIG. 3A, but with the addition of microvia 330. Microvia 330 lacks capture pads. Thus, the methods disclosed herein provide for the formation of vias without requiring the use of or presence of capture pads. In some embodiments, the vias disclosed herein, such as microvia 330, are single solid bodies as opposed to multiple separate layers that are pressed together into a stack. That is, the vias disclosed herein may be or include a single, unitary body.

One skilled in the art would understand that the PCBs disclosed herein are not limited to having the structures shown in FIGS. 2B and 3B, and that the ceramic material and electrically conductive material may be made to have other desired shapes, arrangements, and features that are achievable using 3D-printing techniques and material infusion techniques.

In some embodiments, after the 3D-printing and material infusion processes disclosed herein, the PCBs are subjected to additional processing to achieve the desired shape, arrangement, and/or features prior to deploying the PCB or incorporating the PCB into a system. In other embodiments, after the 3D-printing and material infusion process disclosed herein, the PCBs, without performing any additional processing steps, are deployed or incorporated into a system.

The ceramic substrates of the PCBs disclosed herein form an electrically insulated portion of the PCBs. The ability to 3D-print the substrates from relatively high melting temperature ceramic provides PCBs that are suitable for both relatively low- and relatively high-temperature end-use applications of the PCBs, such as for applications in cold weather environments or relatively hot environments (e.g., downhole environments). For example, the PCBs formed in accordance with the present disclosure may have an operating temperature range of from −200° C. to 350° C. The ability to 3D-print the substrates also provides for PCBs having designed 3D-geometries. The 3D-geometries of the PCBs disclosed herein can be designed to be suited for use in electronic circuits.

As the ceramic is capable of being printed into desired 3D-geometires, the present method provides for relatively high-performance PCB trace geometries. For example, the ability to 3D-print the substrates from ceramic allows for the formation of precise and/or short conductive trace pathways within the ceramic substrate. Such trace pathways are then filled with the electrically conductive material to form conductive connections and components. With more precise and/or shorter conductive pathways, the electrical signals in the PCB can propagate at GHz or higher frequencies.

The ability to use the material infusion disclosed herein provides for PCBs that have solid electrically conductive material components and connections that have a relatively low coefficient of thermal expansion (CTE). The relatively low CTE of the electrically conductive material provides for reduced mechanical stress on the substrate (e.g., on the surface of the substrate), such as when the PCB is operating under relatively high-temperature conditions. Additionally, the relatively low CTE of the electrically conductive material provides for solderability of the electrical components on the PCB. In some embodiments, the ceramic material has a CTE that is sufficiently high to minimize the CTE differential between the electrically conductive material and the ceramic material. For example, in a PCB that includes Copper having a CTE of 17 ppm/° C. as the electrically conductive metal, a ceramic material having a CTE of 10 ppm/° C. would have a lower CTE differential relative to the Copper in comparison to a ceramic material having a CTE of 4 ppm/° C. The relatively low CTE the 3D-printed ceramic substrates disclosed herein provides for PCBs that can maintain reliability and functionality in harsh environments (e.g., high and low temperature environments).

The electrical components and connections, such as vias and traces, formed by the methods disclosed herein can be shaped to have curved or curvilinear geometries including rounded corners, and to eliminate or reduce the presence of relatively sharp corners. For example, the vias and traces can be oval or another round shape. The methods disclosed herein can be used to produce PCBs having less jagged trace lines and vias. In some embodiments, the shapes of the trace lines formed by the methods disclosed herein are free of any right angles. As would be understood by one skilled in the art, right angles can produce signal noise in electrical systems. The trace lines achievable using the methods disclosed herein provide for uniformity of impedance, removal of stray antennas, and a reduction of trace line lengths; thereby, improving the propagation speed and distance of electronic signals in the GHz range and reducing reflections and noise of electronic signals in the GHz range. The electrical components and connections can include transitions that encourage the release of radiofrequency (RF) energy. In some embodiments, the ceramic substrates can be printed to provide the PCBs with a 3D-geometry that facilitates use of the PCBs in relatively high-frequency electronics, including waveguides. For example, plating solutions can be infiltrated through printed voids to plate only the sides of the voids. The resulting hollow, electrically conductive structure can be designed to function as a waveguide. The ability to precisely control the geometries of the electrical components and connections, using 3D-printing, provides PCBs that are capable of relatively higher speed frequencies. The 3D-geometries formed by the present methods can reduce or eliminate various negative effects of current PCB geometries. For example, the methods disclosed herein provide the ability to 3D-print a geometry of the electrical components and connections that forms uniform traces through the ceramic substrate regardless of the direction of the trace. Such uniform traces can reduce or eliminate capacitive and impedance changing properties in comparison to use of traditional cylinder vias with flat traces, and can reduce or eliminate the impedance changing properties resultant from the right angles used in traditional PCBs to transition from one PCB layer to the next. Reducing or eliminating such capacitive and impedance changing properties reduces or eliminates the occurrence of reflections in the electrical signal path; thereby, reducing or eliminating overall trace length and providing for higher frequencies. The 3D-printing of the ceramic substrate provides the ability to form 3D-geometries that define via stacks that are in alignment. This ability can improve the manufacturability and reliability of relatively high-density electronics by reducing or eliminating problems related to tight-tolerances when attempting to align stacked blind and buried vias in a PCB. In some embodiments, the methods disclosed herein eliminate the need to drill holes in the PCB substrate to form voids, as the voids can be printed into the ceramic substrate.

FIG. 4A depicts another ceramic substrate, formed via 3D-printing, having voids for receipt of electrically conductive materials. Ceramic substrate 420a includes body 422, including the ceramic material. Body 422 has sides 426, 428, 442, and 444 (shown in FIG. 4B). Ceramic substrate 420a includes body segment 423, including channel 425 for infusion of a conductive material into voids within body, such as voids 424a.

With reference to FIG. 4B, ceramic substrate 420b is 3D-printed to have cavities 424a-424e extending through body 422. The cavities 424a-424d define the shape and arrangement that the electrical components and connections will take in the PCB after material infusion. For example, cavities 424a define pathways within which electrical traces may subsequently be formed, cavities 424c and 424e define voids within which an inductor may subsequently be formed, and cavities 424d define voids within which capacitors may subsequently be formed. Body segment 423 is coupled with side 442 and configured to facilitate infusion of conductive material into cavities 424a-424e. For example, body segment 423 may be or function as a manifold for input of conductive material into at least some of cavities 424a-424e. Input channel 425 is fluidly coupled with cavities 424b. Conductive material may flow through channel 425 and into cavities 424b.

FIG. 4C depicts the ceramic substrate 420c with conductive material 430 infused within the cavities 424a-424d (shown in FIG. 4B) of the ceramic substrate.

FIG. 4D depicts the ceramic substrate 420d with inductor core 440 positioned within cavity 424e (shown in FIG. 4C), such that the conductive material 430 and inductor core 440 form an inductor. In some embodiments, the material of inductor core 440 is infused in the same or similar manner as conductive material 430. In other embodiments, inductor core 440 is preformed and inserted into cavity 424e.

With reference to FIG. 4E, in some embodiments body segment 423 and channel 425 are removed after infusion of conductive material into ceramic substrate 420e. Ceramic substrate 420e is cut along line 4F-4F to expose side 442.

Figure 4F:
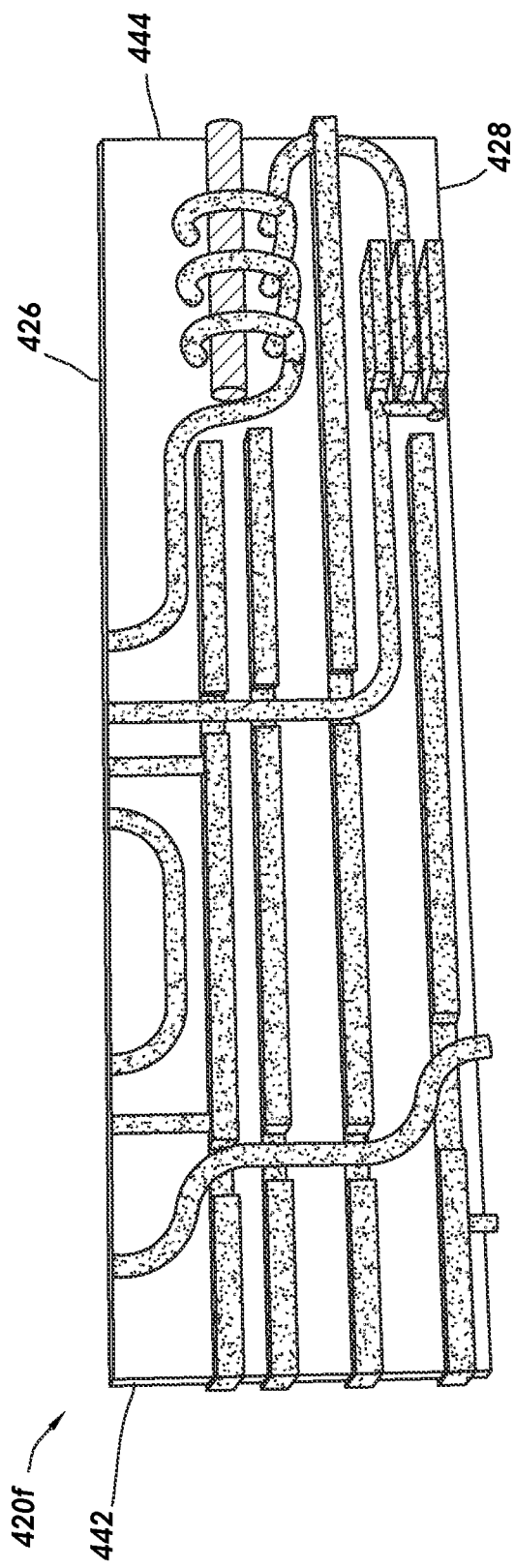
FIG. 4F depicts the ceramic substrate of FIG. 4E, after removal of the body segment with an infusion channel, along line 4F-4F.

FIG. 4F depicts the ceramic substrate 420f after removal of body segment 423 and channel.

Figure 4H:
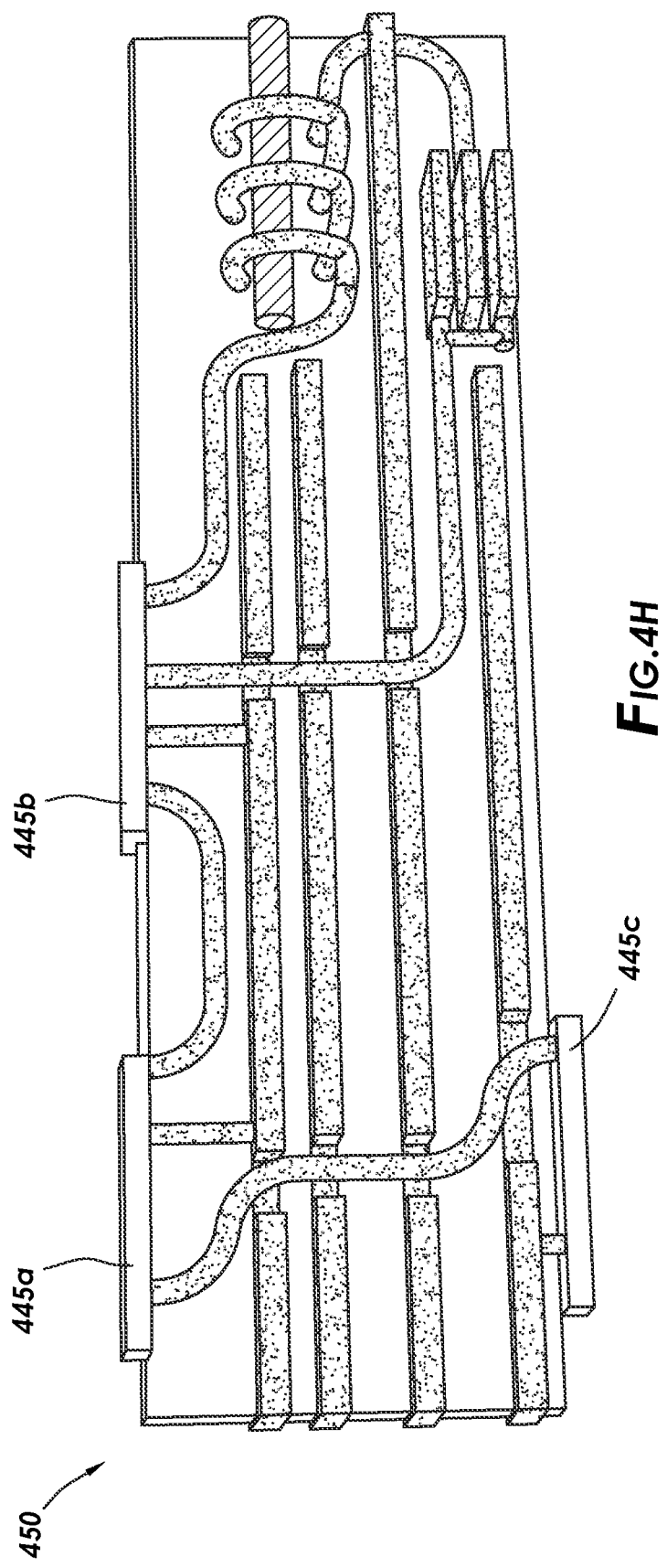
FIG. 4H is a view of the ceramic substrate of FIG. 4G, cut along line 4H-4H.

FIGS. 4G and 4H depict the ceramic substrates after installation of electrical components 445a-445c, forming PCB 450. In some embodiments, prior to installation of electrical components 445a-445c, the material of the infused ceramic substrate is allowed to cure, such as by allowing the conductive material to cool and solidify.

Embodiments of the PCBs disclosed herein can include electronic signal lines that have the same or substantially the same shape and size throughout the ceramic substrate, and that lack right-angle transitions. By reducing or eliminating size and shape changes and right-angle transitions in the electronic signal lines, impedance changes are reduced, reducing signal reflections in the PCBs. In some embodiments, the electronic signal lines are tubular. By 3D-printing the voids, rather than using a drill process for vias, the methods provide for the elimination of capture pads for vias of the PCB. By elimination of capture pads, the diameter and capacitance of the vias can be reduced, such that higher edge rates and high-speed signals with reduced signal noise are attainable.

As the ceramic substrates disclosed are printed with three-dimensional geometries, the electrical components of the PCBs can be positioned on different (e.g., opposite) sides of the PCB, with direct electrical connections between the electrical components. For example, embodiments of the PCBs disclosed herein may attain relatively higher signal densities by providing the ability to have transmitters and receivers positioned on different (e.g., opposite) sides of the ceramic substrate. In some embodiments, the ceramic substrates disclosed herein are not planar.

Figure 5:
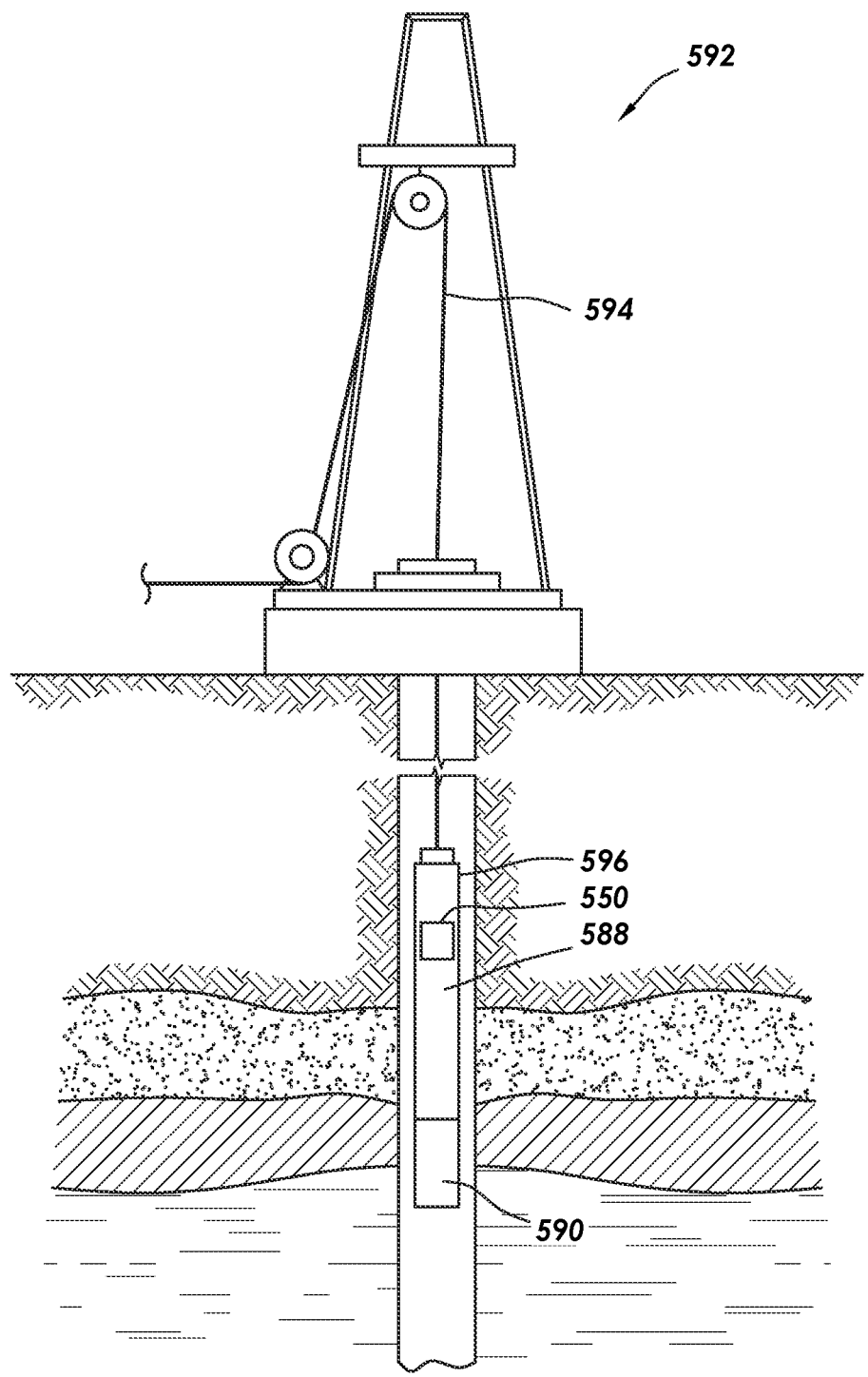
FIG. 5 depicts a PCB incorporated into a logging tool for use in downhole logging operations in accordance with some embodiments of the present disclosure.

FIG. 5 depicts a PCB incorporated into a logging tool for use in downhole logging operations. Logging tool 596 may be lowered downhole on wire 594 at wellsite 592 (e.g., from a logging truck, which is not shown). Logging tool 596 includes a photomultiplier tube, PMT 590. PMT 590 includes high voltage power supply 588, which has a PCB 550, in accordance with the present disclosure, incorporated therein.

Applications

The methods disclosed herein may be used to form PCBs or other electronic components for use in ultra-high-speed electronics (i.e., high-frequency applications). The PCBs or other electronic components disclosed herein may be used in extreme temperature environments, such as for wellbore applications. Due, at least in part, to the CTEs of the materials used herein, the PCBs or other electronic components disclosed herein may be used in applications where self-heating of the components produces localized hot spots, while maintaining reliability and functionality. The PCBs or other electronic components disclosed herein may function as a heat sink, drawing heat away from critical components to reduce the occurrence of localized hot spots.

Due, at least in part, to the ability to 3D-print the geometries of the PCBs, the methods disclosed herein provide the ability to form relatively high-density of electronic circuits. The different 3D-geometries of traces that can be formed using the methods disclosed herein provide for improved electrical signal propagation through the PCBs, such that electrical signals in the GHz range can propagate longer distances with a reduced occurrence of signal noise. This electrical signal propagation increases the speed of electrical signal communication and provides the ability for greater distances between the electrical components that utilize the electrical signal communication. The methods disclosed herein may be use to form multichip module substrates.

The PCBs or other electronic components disclosed herein can be used in automotive applications, aerospace applications, military applications, geothermal applications, wind power generation, solar power generation, and ultra-high frequency commercial and industrial applications. Some exemplary automotive applications of the PCBs or other electronic components disclosed herein include use in trucks, farm equipment, and construction equipment, such as within control systems and sensors mounted on or near engines, exhaust components, and breaks. Some exemplary aerospace applications of the PCBs or other electronic components disclosed herein include use in control systems and sensors for jet and rocket engines.

The PCBs disclosed herein may include or be used in multichip modules, substrates for system in package (SIP), and heterogeneous integration modules. The PCBs disclosed herein can combine multiple die (e.g., memory, custom processors, ASICS, MEMS) and passive components in a package to increase functionality in a smaller footprint or form factor. The PCBs may provide improved performance by reducing signal length between components through direct routing and reduced line spacing in the substrate (e.g., no capture or target pads).

Some other exemplary applications of the PCBs disclosed herein for downhole oil and gas applications include use in high voltage power supplies of PMT in logging tools, electronic firing heads, inductive solenoid valves, interval flow control valves, electrohydraulic flow control and monitoring components, interval seal valves, isolation valves, sensors (e.g., valve position sensors), gauges (e.g., pressure, temperature, or strain gauges), and thermistors.

Although the present embodiments and advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit board, the circuit board comprising:
   a ceramic substrate, the ceramic substrate including a plurality of voids; and
   an electrically conductive material within the plurality of voids, wherein the electrically conductive material defines an electrically conductive wiring assembly of the circuit board, the electrically conductive wiring assembly comprising a via, and wherein the circuit board lacks capture pads, wherein the circuit board comprises a first electrical component positioned on a first surface of the circuit board and a second electrical component positioned on a second surface of the circuit board, wherein the first and second surfaces are different surfaces of the circuit board, and wherein the first and second electrical components are electrically coupled through the electrically conductive wiring assembly.

2. The circuit board of claim 1, wherein at least one of the plurality of voids has a curvilinear extension.

3. The circuit board of claim 1, wherein the first electrical component is a transmitter and the second electrical component is a receiver.

4. A method of making an electrically conductive apparatus, the method comprising:
   3D-printing a ceramic material into a ceramic substrate, the ceramic substrate including a void;
   infusing a material into the void;
   retrieving the ceramic substrate with the material within the void, wherein the material is electrically conductive; and
   after infusing the material into the void, removing air pockets from the void, removing contaminants from the void, or combinations thereof, wherein the removing includes agitating the ceramic substrate, applying a vacuum to the ceramic substrate, or applying positive pressure to the ceramic substrate.

5. The method of claim 4, wherein the material is molten when infused into the void, the method further comprising solidifying the material within the void.

6. The method of claim 4, wherein infusing the material into the void comprises infusing metal into the void.

7. The method of claim 4, wherein infusing the material into the void comprises introducing a solution comprising the material into the void.

8. The method of claim 4, wherein the void is a hole through the ceramic substrate, a cavity in the ceramic substrate, or a channel in the ceramic substrate.

9. The method of claim 4, wherein the ceramic substrate includes a plurality of voids, and wherein the material defines an electrically conductive wiring assembly of the electrically conductive apparatus.

10. The method of claim 4, wherein the material forms a conductive trace, lead, or via.

11. The method of claim 4, wherein the void has a curvilinear extension.

12. The method of claim 4, wherein infusing the material into the void comprises inserting the ceramic substrate into a source of the material, depositing the material onto the ceramic substrate, or injecting the material into the void.

13. The method of claim 4, wherein infusing the material into the void comprises applying a force to the material and ceramic substrate forcing the material into the void.

14. The method of claim 13, wherein applying the force includes applying centripetal force, applying a vacuum, or applying positive pressure.

15. The method of claim 4, further comprising, prior to infusing the material into the void, applying a surface treatment to the ceramic substrate.

16. The method of claim 15, wherein the surface treatment comprises applying a precursor to the ceramic substrate that encourages wicking of the material along a surface of the ceramic substrate, applying a substance to the ceramic substrate that promotes adherence of the material to the ceramic substrate, applying a resist to the ceramic substrate that resists adherence of the material onto the ceramic substrate, or combinations thereof.

17. The method of claim 15, further comprising, prior to applying the surface treatment, masking portions of the ceramic substrate.

18. The method of claim 4, wherein the ceramic material comprises Zirconia, Alumina, Aluminum Nitride, Silicate, Silicon Nitride, synthetic quartz, or fused silica.

19. The method of claim 4, wherein the material comprises an electrically conductive metal.

20. The method of claim 4, wherein the material comprises an electrically conductive non-metal.

21. The method of claim 4, wherein infusing the material into the void comprises infusing the material through a channel within a segment of the ceramic substrate, wherein the channel is fluidly coupled with the void, and wherein, after the infusing, the segment is removed from a remainder of the ceramic substrate.

22. A method of making an electrically conductive apparatus, the method comprising:
   3D-printing a first ceramic material into a first portion of a ceramic substrate, the first portion of the ceramic substrate including a first void;
   infusing a first material into the first void;
   prior to infusing the material into the first void, applying a surface treatment to the first portion of the ceramic substrate;
   forming a second portion of the ceramic substrate by 3D-printing a second ceramic material onto the first portion of the ceramic substrate, the second portion of the ceramic substrate including a second void;
   infusing a second material into the second void;
   prior to infusing the material into the second void, applying a surface treatment to the second portion of the ceramic substrate;
   retrieving the ceramic substrate with the first and second material within the first and second voids, wherein the first and second materials are electrically conductive materials, and wherein the surface treatment comprises applying a precursor to the ceramic substrate that encourages wicking of the material along a surface of the ceramic substrate, applying a substance to the ceramic substrate that promotes adherence of the material to the ceramic substrate, applying a resist to the ceramic substrate that resists adherence of the material onto the ceramic substrate, or combinations thereof.

23. The method of claim 22, the first ceramic material and the second ceramic material are the same material.

24. The method of claim 22, wherein the first material and the second material are the same materials.

25. The method of claim 22, wherein the first void and the second void are coupled in the ceramic substrate.

\* \* \* \* \*